(12) United States Patent
Patel et al.

(10) Patent No.: US 9,800,134 B2
(45) Date of Patent: Oct. 24, 2017

(54) MOTOR DRIVE WITH LCL FILTER INDUCTOR WITH BUILT-IN PASSIVE DAMPING RESISTOR FOR AFE RECTIFIER

(71) Applicant: Rockwell Automation Technologies, Inc., Mayfield Heights, OH (US)

(72) Inventors: Yogesh P. Patel, Grafton, WI (US); Lixiang Wei, Mequon, WI (US)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 72 days.

(21) Appl. No.: 14/630,866

(22) Filed: Feb. 25, 2015

(65) Prior Publication Data

US 2016/0248334 A1   Aug. 25, 2016

(51) Int. Cl.
*H02M 1/12*   (2006.01)
*H03H 7/06*   (2006.01)
*H03H 7/01*   (2006.01)
*H02M 5/458*  (2006.01)

(52) U.S. Cl.
CPC .............. *H02M 1/126* (2013.01); *H03H 7/06* (2013.01); *H03H 7/1741* (2013.01); *H02M 5/4585* (2013.01)

(58) Field of Classification Search
CPC ...... H02M 1/08; H02M 5/458; H02M 5/4585; H02M 1/32; H02M 1/4216; H02M 1/4225; H02M 2001/0022; H02M 2001/327; H02M 7/217; H02M 7/219; H02P 27/06; Y02B 70/1483
See application file for complete search history.

(56) References Cited

U.S. PATENT DOCUMENTS

| | | |
|---|---|---|
| 4,772,996 A | 9/1988 | Hanei et al. |
| 4,937,719 A | 6/1990 | Yamada et al. |
| 5,343,381 A | 8/1994 | Bolduc et al. |
| 5,541,442 A * | 7/1996 | Keil ........................ H01L 27/08 257/531 |
| 5,912,813 A | 6/1999 | Kerkman et al. |
| 5,936,298 A * | 8/1999 | Capocelli ............ H01F 17/0033 257/531 |

(Continued)

FOREIGN PATENT DOCUMENTS

| | | |
|---|---|---|
| CN | 204441884 U | 7/2015 |
| DE | 2704112 A1 | 7/1978 |

(Continued)

OTHER PUBLICATIONS

Ahmed, et al., "Passive Filter Design for Three-Phase Inverter Interfacing in Distributed Generation", IEEE Xplore, downloaded on Apr. 18, 2010 at 13:45:10 UTC from IEEE Xplore, 9 pgs.

*Primary Examiner* — Fred E Finch, III
*Assistant Examiner* — Demetries A Gibson
(74) *Attorney, Agent, or Firm* — Fay Sharpe LLP

(57) ABSTRACT

Power conversion systems, filter circuits and integrated filter resistor and inductor apparatus are presented, in which a damping resistor is integrated with a filter inductor by winding joined resistor winding portions proximate to one another at least partially around a filter inductor core leg to form an integrated filter resistor and inductor apparatus for interconnection with filter capacitors to provide an input filter or an output filter for a motor drive or other power conversion system.

20 Claims, 7 Drawing Sheets

(56) References Cited

U.S. PATENT DOCUMENTS

| | | | |
|---|---|---|---|
| 5,936,299 A * | 8/1999 | Burghartz | H01L 28/10 257/108 |
| 6,166,929 A | 12/2000 | Ma et al. | |
| 6,269,010 B1 | 7/2001 | Ma et al. | |
| 6,842,351 B2 | 1/2005 | Gauthier et al. | |
| 6,934,167 B2 | 8/2005 | Jang et al. | |
| 7,190,143 B2 | 3/2007 | Wei et al. | |
| 7,274,576 B1 | 9/2007 | Zargari et al. | |
| 7,502,238 B2 | 3/2009 | Wei et al. | |
| 7,602,622 B2 | 10/2009 | Wei et al. | |
| 7,606,052 B2 | 10/2009 | Akagi | |
| 7,728,544 B2 | 6/2010 | Qian et al. | |
| 8,270,191 B2 * | 9/2012 | Zhu | H02M 1/126 363/132 |
| 8,325,500 B2 * | 12/2012 | Schueneman | H02M 1/126 363/47 |
| 8,816,631 B2 | 8/2014 | Wei et al. | |
| 8,928,431 B2 * | 1/2015 | Koechlin | H01P 1/20381 333/168 |
| 8,934,274 B2 | 1/2015 | Kawashima | |
| 2005/0134515 A1 * | 6/2005 | Copeland | H01Q 1/22 343/788 |
| 2008/0084643 A1 * | 4/2008 | Flottemesch | H02J 3/34 361/93.2 |
| 2008/0278109 A1 | 11/2008 | Qian et al. | |
| 2012/0187883 A1 * | 7/2012 | Valdez | H02M 1/126 318/490 |
| 2013/0038139 A1 * | 2/2013 | Shudarek | H02M 1/126 307/105 |
| 2013/0076285 A1 | 3/2013 | Choi et al. | |
| 2013/0241451 A1 | 9/2013 | Wei et al. | |
| 2013/0286692 A1 | 10/2013 | Patel et al. | |
| 2013/0289911 A1 | 10/2013 | Patel et al. | |
| 2013/0342138 A1 * | 12/2013 | Permuy | H02M 5/42 318/400.3 |
| 2014/0191823 A1 * | 7/2014 | Otsubo | H02M 1/126 333/181 |
| 2014/0268953 A1 | 9/2014 | Patel et al. | |
| 2014/0268954 A1 | 9/2014 | Wei et al. | |
| 2015/0145523 A1 * | 5/2015 | Harada | G01R 31/42 324/538 |
| 2016/0099664 A1 * | 4/2016 | Niwa | H02P 6/002 318/400.3 |
| 2016/0218524 A1 * | 7/2016 | Bayerer | H02M 7/003 |

FOREIGN PATENT DOCUMENTS

| | | |
|---|---|---|
| EP | 0975084 A2 | 1/2000 |
| EP | 2200165 A1 | 6/2010 |
| JP | H07322484 A | 12/1995 |
| WO | WO 2012/097529 A1 | 7/2012 |

* cited by examiner

US 9,800,134 B2

MOTOR DRIVE WITH LCL FILTER INDUCTOR WITH BUILT-IN PASSIVE DAMPING RESISTOR FOR AFE RECTIFIER

TECHNICAL FIELD

The subject matter disclosed herein relates to power conversion, and more specifically to filters for motor drives and other power conversion systems.

BRIEF DESCRIPTION

Various aspects of the present disclosure are now summarized to facilitate a basic understanding of the disclosure, wherein this summary is not an extensive overview of the disclosure, and is intended neither to identify certain elements of the disclosure, nor to delineate the scope thereof. Rather, the primary purpose of this summary is to present various concepts of the disclosure in a simplified form prior to the more detailed description that is presented hereinafter. The present disclosure provides filter circuits for motor drives and other power conversion systems using integrated filter resistor and inductor apparatus in which a damping resistor is integrated with a filter inductor by winding joined resistor winding portions proximate to one another at least partially around a filter inductor core leg for interconnection with filter capacitors to provide a damped LC or LCL input or output filter.

BRIEF DESCRIPTION OF THE DRAWINGS

The following description and drawings set forth certain illustrative implementations of the disclosure in detail, which are indicative of one or more exemplary ways in which the various principles of the disclosure may be carried out. The illustrated examples are not exhaustive of the many possible embodiments of the disclosure. Various objects, advantages and novel features of the disclosure will be set forth in the following detailed description when considered in conjunction with the drawings, in which.

DETAILED DESCRIPTION

Figure 1:
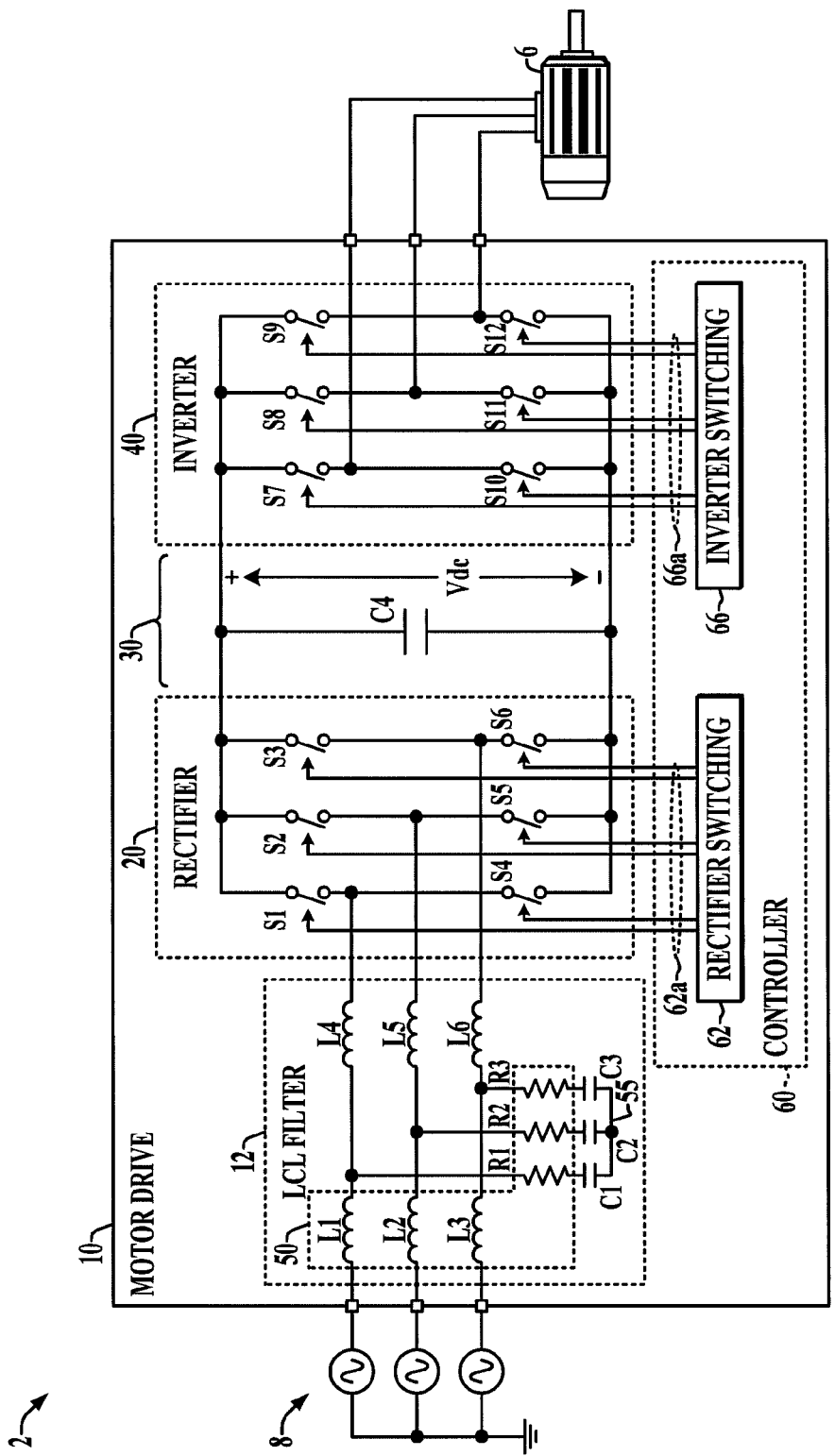
FIG. 1 is a schematic system diagram.

Presently disclosed embodiments relate generally to power conversion systems and filter circuits therefor. Motor drives and other electric power conversion systems convert input power from a line-side source to a different form to provide controlled drive currents and voltages to the windings of an electric motor or other load, where the output frequency and current or voltage amplitude are typically variable. Many such systems include an active front end (AFE) rectifier or converter circuit with AC input power being rectified to create DC link power in an intermediate DC circuit. The intermediate DC power is fed to an output inverter which creates a variable frequency AC output driving a motor load at a controlled speed, position and/or torque in motor drive applications. Such variable frequency drives (VFDs) often include filter circuits at the power input and/or load output, including inductors and capacitors formed in an LC or LCL configuration. For instance, input filters are often employed in conjunction with active front end (e.g., switching) rectifiers to control harmonics, wherein LCL filters generally suppress harmonics other than a fundamental frequency and a system resonant frequency. However, the use of such LCL or LC input filter may actually introduce resonance to the active converter system when the power converter is connected to a high impedance or "soft" AC source. In motor drive applications, it is desirable to employ input filters while mitigating or avoiding system resonance at or near the operating or switching frequency of the active front end converter, and increased source or grid impedance tends to decrease the system resonant frequency. Output or "sine wave" filters are sometimes provided between the output inverter and a driven load in order to suppress reflected wave voltage spikes associated with pulse width modulated (PWM) variable frequency drives. Active and passive damping techniques may be used to combat resonance with respect to input or output filters. Active damping for input filters, however, requires a higher control loop bandwidth in order to compensate for the resonance frequency components.

The present disclosure instead contemplates use of passive damping resistance integrated into the LC or LCL filter circuit inductors in order to mitigate or avoid the adverse effects of system resonance, with the damping resistance effectively reducing the amplitude of oscillations at or near the resonant frequency. The use of integral filter damping resistances provides significant advantages compared with use of external discrete damping resistor components as detailed further hereinafter. In particular, the use of damping resistance in an LC or LCL input or output filter can significantly reduce resonant conditions in a power conversion system, and thus make the system more robust without necessarily requiring adjustment in the input converter or output inverter switching or operating frequency, and also accommodating variability in the impedance (e.g., softness) of an AC input power source.

Example embodiments are illustrated and described below in the context of three-phase AC motor drives, although the various disclosed concepts find utility in connection with any single phase implementation or multiphase configuration with three or more phases of input and/or output power. The described apparatus and techniques, moreover, may be employed for any configuration of input and/or output filter circuits in which an inductance and a resistance are used alone and/or in combination with one or more capacitors forming an input or output filter circuit, power factor correction circuit, power device switching commutation circuit, multiphase LC or LCL filter circuit for power converter input and/or output stages, and/or for multiphase LC filter or LCL filter circuits associated with an AC input or AC output of a power conversion system, and/or other forms of filters involving inductors and resistors as filtering components. In addition, the described apparatus and techniques may be employed in association with filter circuits having any suitable grounding configuration, including without limitation filter circuits that are ungrounded, impedance grounded and/or directly grounded, etc., whether the capacitors and series damping resistors are connected in a Δ configuration, a "Y" configuration, or other resistor/capacitor interconnection topology. For example, the integration of a damping resistor with a filter inductor may be employed in filter circuits employing resistors in a Y connection, with capacitors connected in any Δ or other interconnections. In addition, the disclosed concepts may be used for filters employing capacitors that are single devices or capacitor banks which are formed from a plurality of component capacitors or combinations thereof, whether connected in series, parallel or series/parallel combinations in combination with damping resistances, tuning inductors and/or other auxiliary devices.

Figure 2:
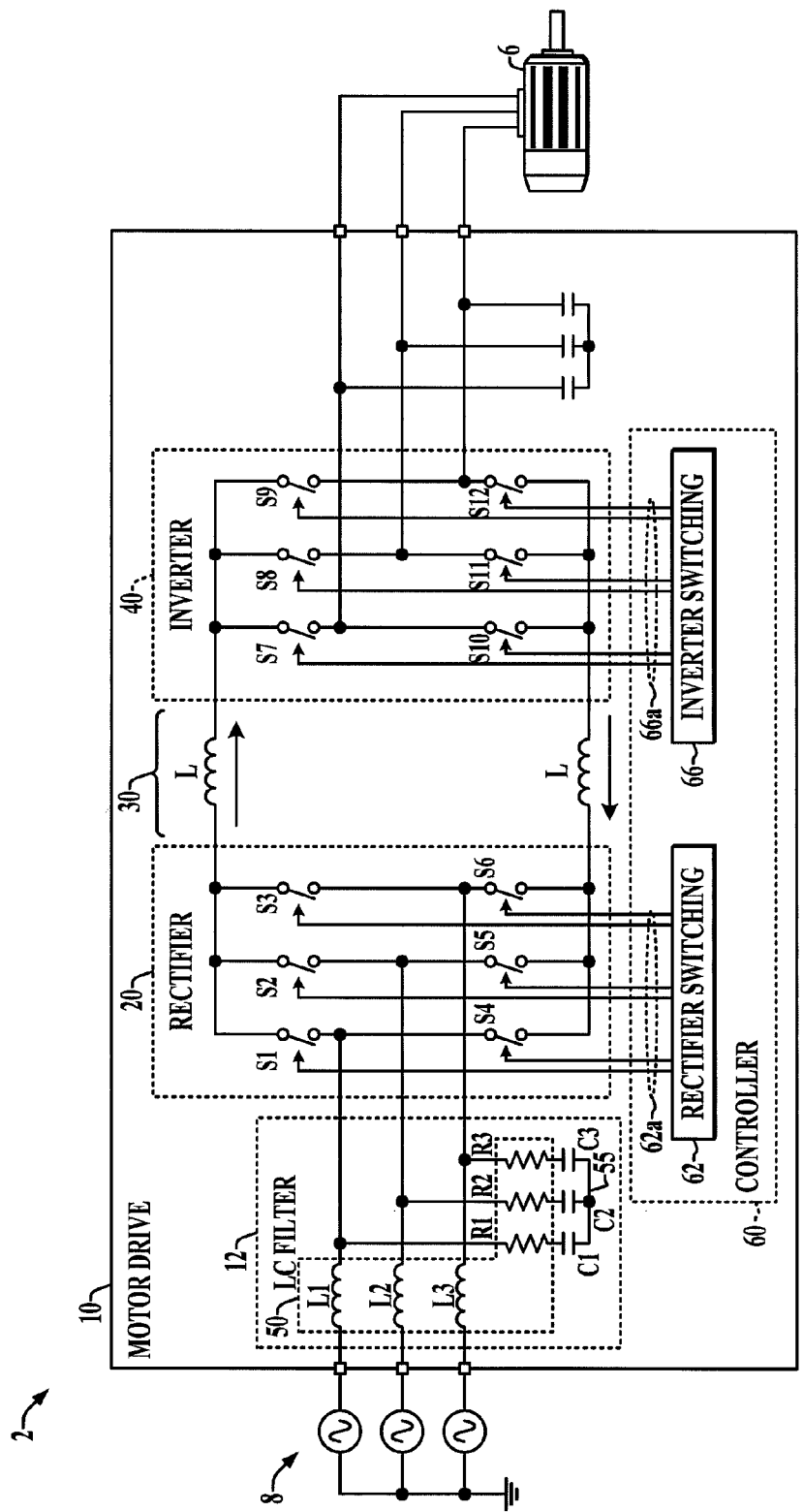
FIG. 2 is a schematic system diagram.

Referring initially to FIGS. 1 and 2, FIG. 1 illustrates a power conversion system 2 including a motor drive 10 with an integral LCL input filter circuit 12 and an input rectifier 20 operated by a drive controller 60. Other embodiments are possible in which one or more damping resistors are integrated into an inductor for a single phase LC or LCL filter. Moreover, the described integrated inductor/damping resistor techniques and apparatus can be employed in systems using a multi-level voltage source rectifier and/or inverter. The illustrated drive 10 has AC input lines receiving multiphase AC input power from a source 8, with rectifier switching devices S1-S6 individually coupled through the filter 12 between a corresponding AC input node and a corresponding DC output node, where the switches S1-S6 are operated according to rectifier switching control signals 62a from a rectifier controller 62 to convert the AC input power and provide DC output power to an intermediate DC link circuit 30 including a DC link capacitance C (FIG. 1). The drive 10 also includes an output inverter 40 receiving DC input power from the DC link circuit 30 and providing AC output currents and voltages to drive a motor load 6. The inverter 40 includes switching devices S7-S12 individually coupled between a corresponding DC link circuit node and a corresponding one of three AC output nodes or terminals. The inverter switching devices S7-S12 are operated according to inverter switching control signals 66a from an inverter controller 66 in order to convert DC power from the link circuit 30 to provide multiphase, variable frequency, variable amplitude AC output power to drive the motor 6. Any suitable inverter switching devices may be used in the active rectifier 20 and/or the output inverter 40, including without limitation insulated gate bipolar transistors (IGBTs), silicon controlled rectifiers (SCRs), gate turn-off thyristors (GTOs), integrated gate commutated thyristors (IGCTs), etc.

The various aspects of the present disclosure are hereinafter described in connection with a three-phase output inverter 40, although different embodiments are contemplated involving more than three output phases or a single output phase to drive an AC motor load 6. As seen in FIG. 1, moreover, the illustrated motor drive 10 receives multiphase AC input power from a three-phase source 8, although embodiments are possible using single-phase input power and/or multiphase input power from a source 8 having more than three phases. In the illustrated embodiment of FIG. 1, the motor drive 10 is a voltage source converter architecture having a DC bus circuit connected to the output terminals of the rectifier 20, with the DC link capacitance C connected between the positive and negative DC bus terminals as shown.

FIG. 2 illustrates another possible embodiment in which a current source converter configuration is used having an intermediate DC link circuit 30 providing a regulated DC link current to the inputs of the inverter 40, where the DC link circuit 30 may include one or more DC link chokes or inductances L. In this non-limiting example, the input filter 12 is an LC filter with first inductors L1-L3, and with L4-L6 omitted, and the motor drive 10 in this case includes Y-connected output filter capacitors coupled between the inverter 40 in the motor load 6.

Referring now to FIGS. 1-4, various implementations include input filter circuits 12 and/or output filters 12, and may further provide an output transformer (not shown) coupled between the motor drive 10 and the motor load 6. Moreover, the present disclosure provides apparatus and techniques for integration of damping resistance and filter inductance to provide the input and/or output filter circuits 12. The filter circuit 12 in one embodiment is a three-phase LCL filter configuration having LCL filter phase circuits associated with each AC phase. In the case of FIGS. 1-4, the filter 12 is an input filter circuit having three filter phase circuits corresponding to the three AC input phases provided by the source 8. Each filter phase circuit in this example includes a first filter inductor L1-L3 (L1 for a first filter phase circuit, L2 for a second filter phase circuit, and L3 for a third filter phase circuit in the illustrated three phase example). The individual filter phase circuits in the case also include a second filter inductor L4-L6, as well as a damping resistance R1-R3 integrated with the first filter inductors L1-L3. The damping resistors R1-R3 in this example are connected in series with a corresponding filter capacitance C1-C3 between the node joining the first and second filter inductors and a common connection node 55, in this case a filter neutral point to which the filter capacitances C1-C3 are connected. In this fashion, an LCL filter is provided for each AC input phase between the source 8 and the AC input lines or nodes of the active front end rectifier 20.

Figure 8:
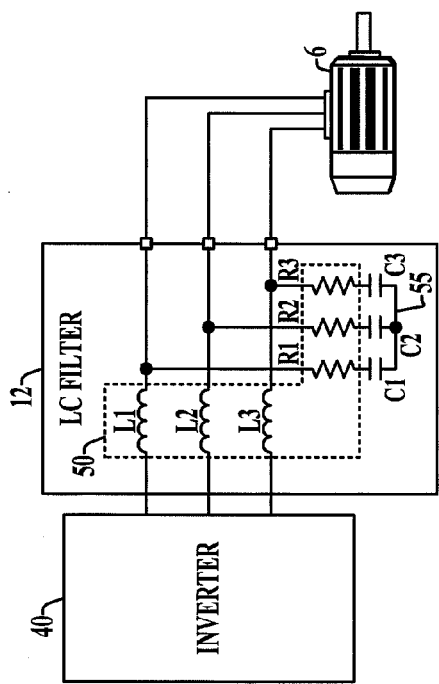
Figure 9:
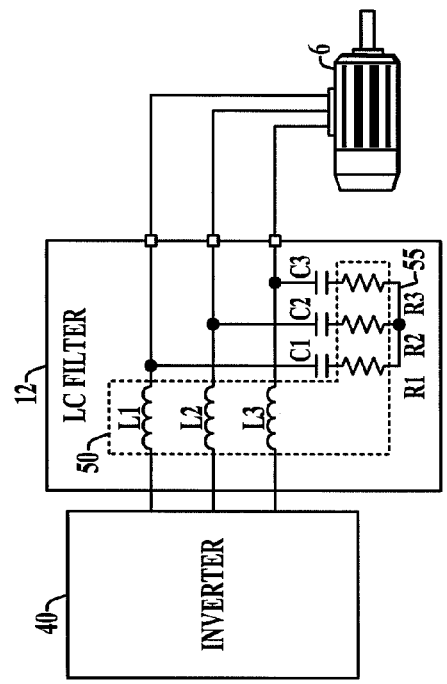

In other embodiments (e.g., FIGS. 5-7 below), the second filter inductors L4-L6 can be omitted to provide an LC filter. Moreover, LC and/or LCL output filters can be provided having integrated damping resistors and filter inductor apparatus 50, for example, three phase LC filter circuits 12 as shown in FIGS. 8 and 9 below. In addition, the damping resistors R1-R3 can be connected with the corresponding filter capacitors C1-C3 in any suitable arrangement, where the examples of FIGS. 1-3, 6 and 8 provide for series connection of the damping resistors R1-R3 and the filter capacitors C1-C3 with the lower terminals of the filter capacitors C1-C3 connected to one another at the common connection node 55, and where the embodiments of FIGS. 5, 7 and 9 having the damping resistors R1-R3 connected to one another at the common connection node 55.

Figure 3:
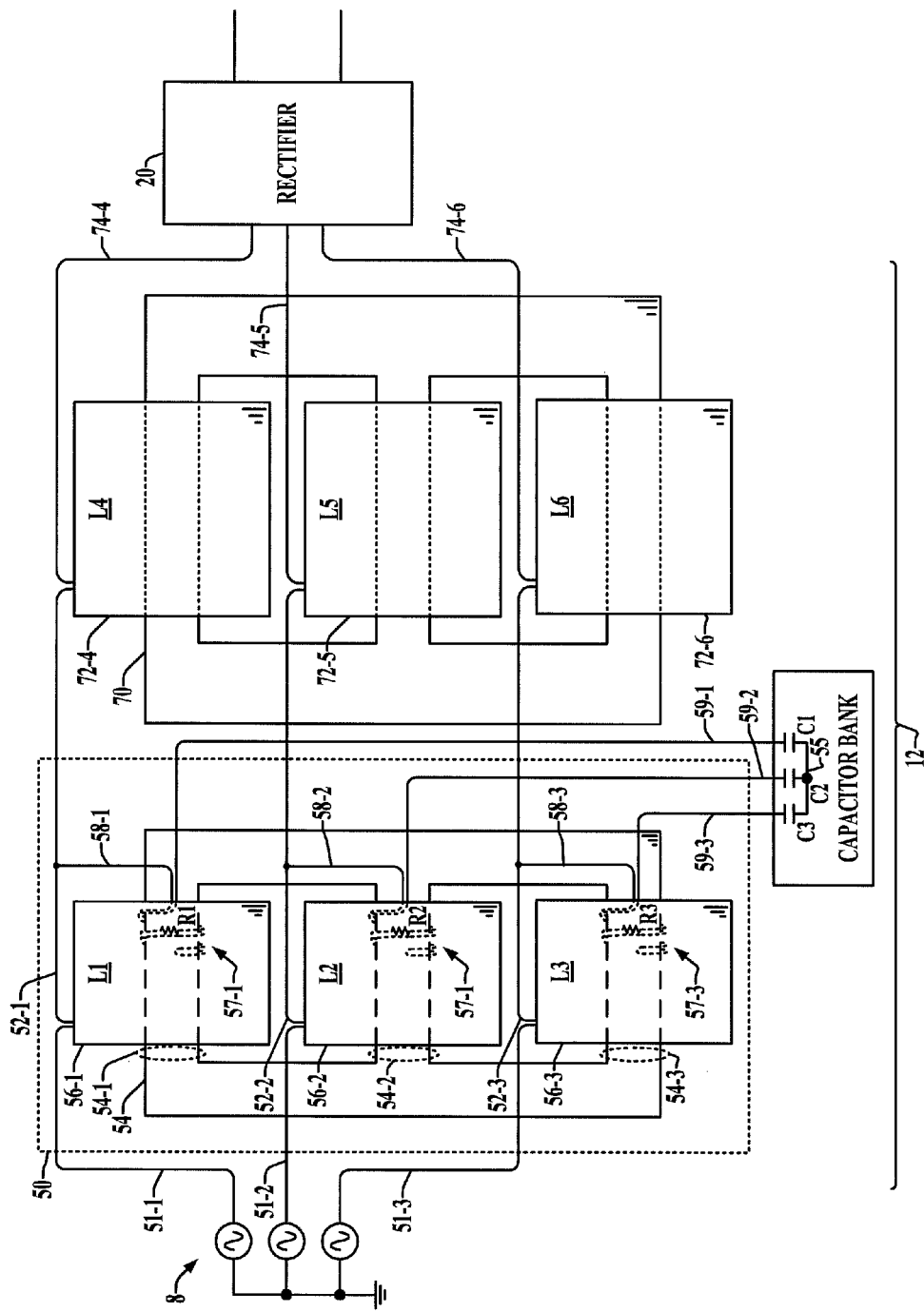
FIG. 3 is a partial schematic side elevation view.
Figure 4:
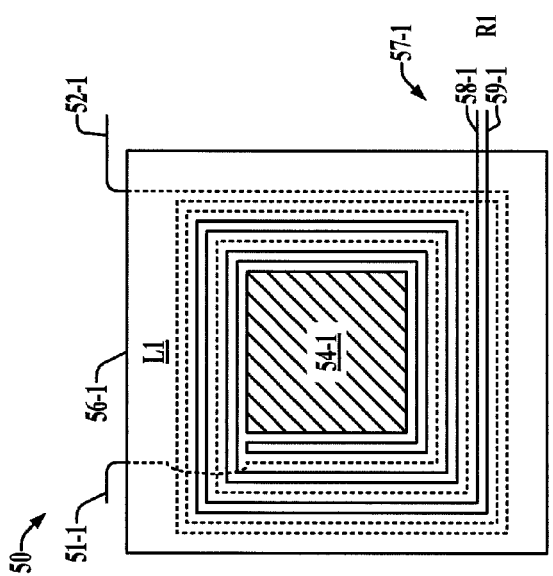
FIG. 4 is a simplified sectional top elevation view.

As best seen in FIGS. 3 and 4, the filter circuit 12 comprises a novel integrated resistor and inductor apparatus 50 having an inductor core structure 54 with three core legs 54-1, 54-2 and 54-3 around which corresponding first inductor windings 51 and 52 are wound to form the first inductors L1-L3. Specifically, the first inductor 56-1 (L1) for the first AC input phase is formed of a winding 51-1, 52-1 wound around the first core leg 54-1, the inductor 56-2 (L2) for the second AC input phase is formed of a winding 51-2, 52-2 wound around the second core leg 54-2, and the inductor 56-3 (L3) is formed via a winding 51-3, 52-3 wound around the third core leg 54-3. Where included (e.g., in an LCL filter structure), a second core structure 70 includes the second inductors L4-L6 of the three corresponding filter phase circuits, with windings 72-4, 72-5 and 72-6 formed around corresponding core legs and having output leads 74-4, 74-5 and 74-6 connected to the AC input lines of the rectifier 20 (FIG. 3). As previously mentioned, LC filters can be provided, in which case the second inductor core structure 70 and the corresponding inductors L4-L6 can be omitted, with the second portions of the inductor windings 52-1, 52-2 and 52-3 being connected to the rectifier AC inputs.

As schematically shown in FIG. 3, the integrated apparatus 50 includes the first inductors L1-L3 as well as integrated damping resistors 57-1, 57-2 and 57-3 (R1-R3), formed by resistor windings wound at least partially around the corresponding core legs 54-1, 54-2 and 54-3 of the first core structure 54. Each damping resistor (e.g., R1) includes first and second resistor winding portions 58-1 and 59-1, each portion having first and second ends, where the second ends of the resistor winding portions 58-1 and 59-1 are joined to one another such that the portions provide a series resistance (R1) between the externally accessible first ends thereof.

As further seen in FIG. 4, the first resistor R1 includes a first resistor winding portion 58-1 and a second winding portion 59-1, where the first ends of the portions 58-1 and 59-1 are externally accessible, and the second ends of the portions 58-1 and 59-1 are joined to one another. Thus, the first resistor winding 58-1, 59-1 provides a loop, with the portions 58-1 and 59-1 being joined at one end and wound at least partially around the first core leg 54-1 proximate to one another to mitigate coupling. Any suitable resistor winding or wire can be used for the integrated resistor R1, preferably having suitable insulation and sufficient dielectric breakdown rating to accommodate interleaved winding along with the corresponding inductor windings 51-1, 52-1. Moreover, the total length and thus the total resistance of the wire or winding 58-1, 59-1 can be tailored to proved any desired amount of damping resistance to tune the filter circuit 12 for a given design performance with respect to resonance damping.

As seen in the embodiment of FIG. 4, moreover, the resistor winding can be interleaved to a certain extent with the corresponding first inductor winding 51-1, 52-1, with the resistor winding portions 58-1 and 59-1 being wound proximate the first inductor winding 51-1, 52-1 at least partially around the core leg 54-1. The resistor winding or loop including the joined portions 58-1 and 59-1 can be initially wound around the core leg 54-1 followed by winding of the inductor winding 51-1, 52-1 (e.g., as schematically shown in FIG. 3) in one embodiment. In another possible embodiment, the resistor winding 58-1, 59-1 can be wound around the core leg 54-1 as the inductor winding 51-1, 52-1 is wound, or the resistor winding can be wound after the inductor winding 51-1, 52-1, or combinations of these assembly approaches using any suitable winding methodology. In practice, the resistor winding including the side-by-side portions 58-1 and 59-1 are typically much shorter than the inductor winding 51-1, 52-1 and thus winding of the inductor winding 51-1, 52-1 generally continues after the resistor portions 58-1 and 59-1 have been wound at least partially around the core leg 54-1. The integrated filter inductor L2, L3 and damping resistor R2, R3 of the other two AC phases are constructed in similar fashion in certain implementations, although different winding configurations and/or resistance values can be used for different filter phase circuits in some embodiments if desired.

As seen in FIGS. 1-3, the resistor of a given filter phase circuit (e.g., R1 or 57-1 in the first filter phase circuit) is coupled between the first filter inductor L1 and the capacitance (e.g., C1) of the given filter phase circuit, and the capacitance C1 is coupled between the corresponding resistor 57-1 and the filter common connection node 55. It is further noted in FIG. 3 that the multiphase integrated filter inductor/resistor apparatus 50 is constructed as a single multiphase device with the filter inductors L1-L3 and damping resistors R1-R3 wound on a single common core structure 54. Other embodiments are possible in which the individual filter inductor/integrated resistor devices are wound on a corresponding single separate core, with three such core structures provided for a three phase filter circuit 12.

Figure 5:
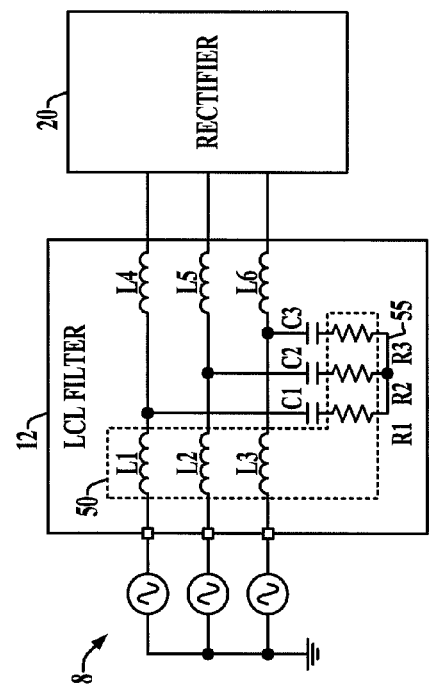
FIGS. 5-12 are schematic diagrams.

FIG. 5 illustrates another filter circuit embodiment 12, in which the capacitance (e.g., C1) of a given filter phase circuit is coupled between the corresponding first filter inductor L1 and integrated resistor R1. As seen in FIG. 5, moreover, the resistor 57-1 of the given filter phase circuit is coupled between the capacitance C1 of the given filter phase circuit and the filter common connection node 55, with the resistors 57 of the three filter phase circuits being tied together at the common connection point or neutral node 55 in the illustrated Y configuration.

Although the illustrated LC and LCL filter circuits 12 are shown in Y-connected configurations, other embodiments are possible in which filter circuits are connected in a Δ circuit, with the circuit 12 being configured by suitable interconnections of the accessible ends of the resistor winding portions 58-1 and 59-1, the inductor winding 51-1, 52-1, and the filter capacitors C1-C3, wherein the filter capacitors C1-C3 may be configured as a unitary capacitor bank in certain embodiments.

Figure 6:
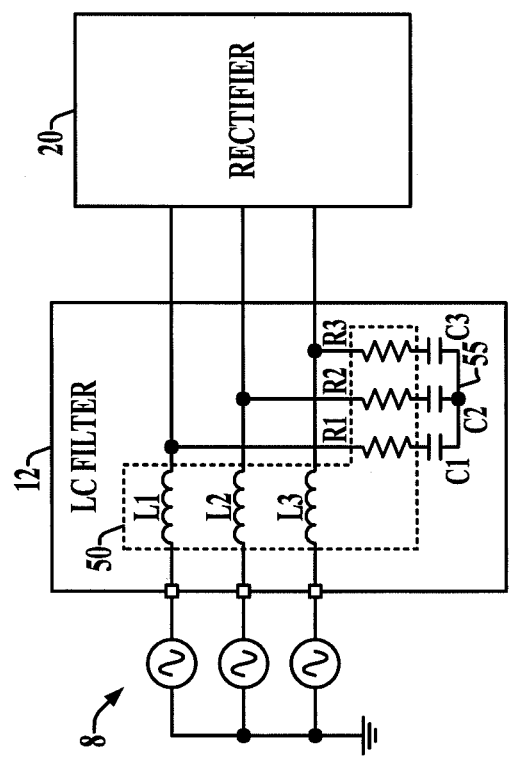

FIG. 6 illustrates another non-limiting embodiment providing a three-phase LC input filter circuit 12, similar to the embodiments described above, with the second inductors (L4-L6) of the individual filter phase circuits omitted. Also, this embodiment provides for common connection of the filter phase circuit capacitors at the neutral point 55, with the integrated damping resistors R1-R3 individually coupled between the corresponding filter capacitor C1-C3 and the corresponding integrated inductor L1-L3 as shown.

Figure 7:
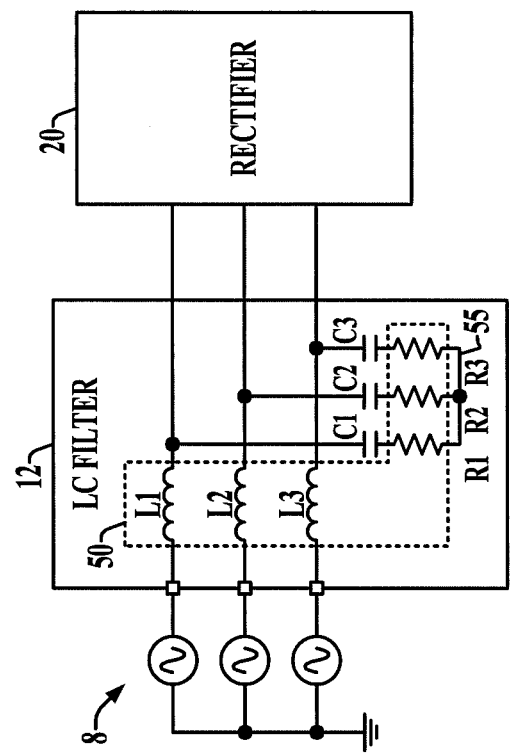

FIG. 7 illustrates another embodiment of an integrated input filter circuit 12 disposed between the AC input source 8 and the rectifier 20. Like the example of FIG. 6, the filter circuit 12 in FIG. 7 is an LC filter with first inductors L1-L3 and integrated resistors R1-R3, with the filter capacitors C1-C3 coupled between the inductors L1-L3 and corresponding integrated damping resistors R1-R3.

Referring now to FIGS. 8-12, the integrated inductor/resistor apparatus 50 can be employed in output filter circuits 12 including one or more filter phase circuits individually coupled between an AC output phase of the inverter 40 and a phase line of a motor load 6, directly or through an intervening transformer (not shown). In the examples of FIGS. 8 and 9, moreover, LC filter circuits 12 are provided, although other implementations are possible in which each filter phase circuit includes a second inductor (e.g., L4-L6 above) between the first inductor L1-L3 and the motor load 6. In the embodiment of FIG. 8, the filter capacitors C1-C3 are coupled together at the common connection node 55, whereas the filter resistors R1-R3 are connected to the common connection node 55 in the example of FIG. 9.

Figure 10:
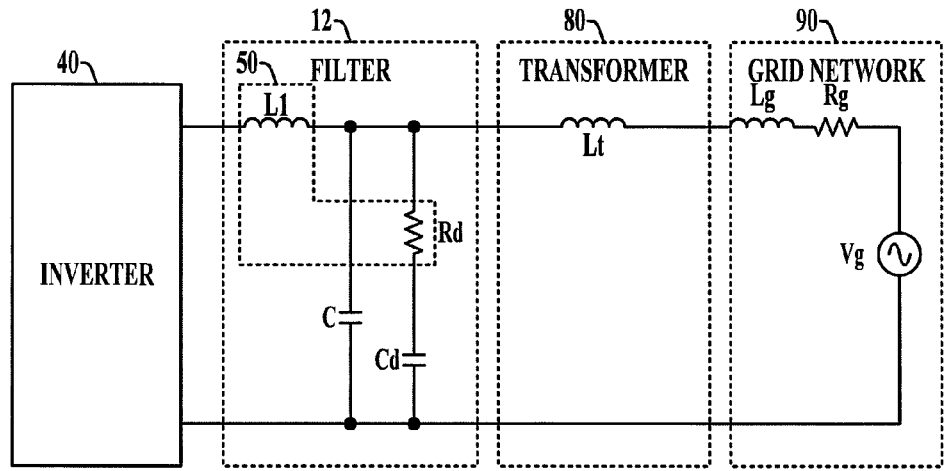
Figure 11:
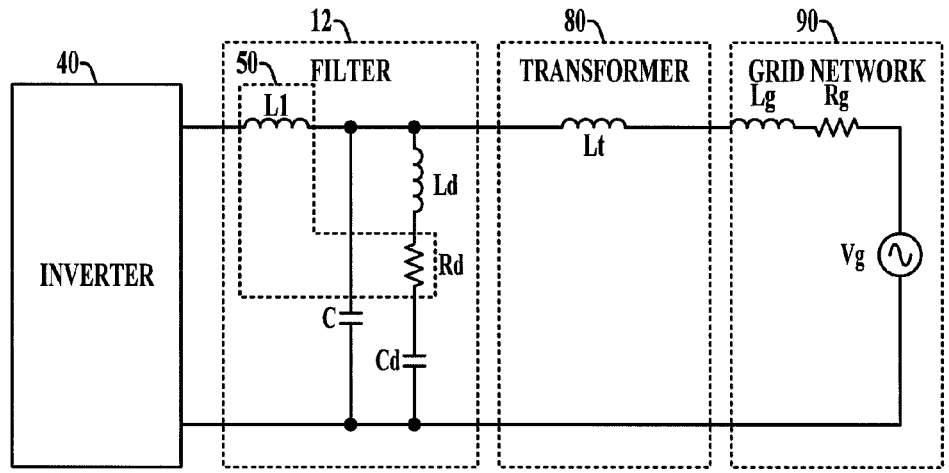
Figure 12:
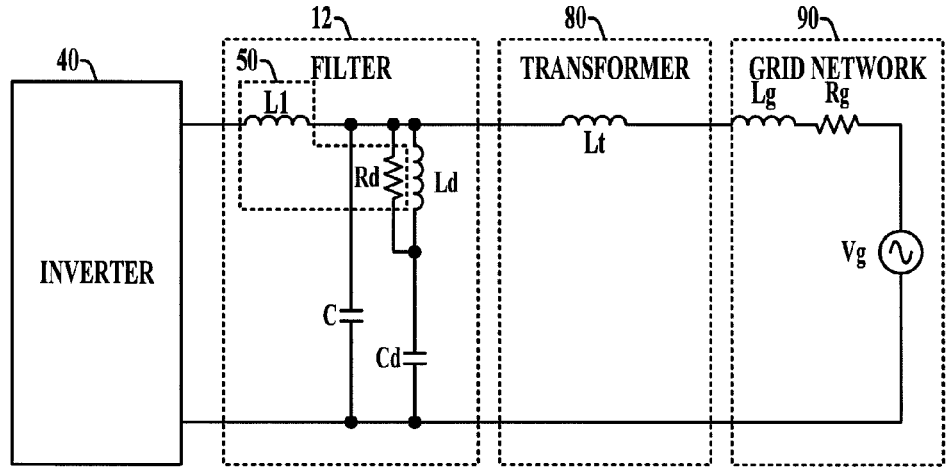

FIGS. 10-12 show further non-limiting examples in which a simplified single phase output filter example 12 is disposed between an inverter 40 and a grid network 90 having a grid inductance Lg, a grid resistance Rg and a grid voltage Vg, with an output transformer 80 having an inductance Lt coupled between the filter circuit 12 and the grid network 90. These concepts can also be employed in multiphase examples including any suitable Δ and/or Y-connected multiphase filter circuits 12 (not shown). In the example of FIG. 10, the filter circuit 12 includes a first inductor L1 and a filter capacitance C1 forming an LC circuit for the illustrated phase, as well as a damping circuit including a damping resistor Rd and a damping capacitor Cd. In this case, the damping resistor Rd is integrated using the above-described techniques with the first inductor L1 to form an integrated apparatus 50. FIG. 11 illustrates another output filter 12 in which a damping inductance Ld is included in series with the damping resistor Rd. In the illustrated example, the damping resistor Rd and the first (series) filter inductor L1 are integrated in the apparatus 50. Other embodiments are possible, for example, with the damping resistor Rd being integrated with the damping inductor Ld. In FIG. 12, a different configuration is shown, with the damping resistor Rd and the damping inductor Ld being connected in parallel with one another, in series with the damping capacitor Cd. As shown, the damping resistor Rd is integrated with the inductor L1, but other integrated apparatus 50 may be employed, for example, integrating the damping resistor Rd with the damping inductor Ld using the techniques described above.

As seen above, the provision of an integrated resistor and inductor apparatus 50 advantageously facilitates compact construction of a variety of different input and/or output filter topologies. Moreover, the integration of the damping resistor R1 with the corresponding filter inductor L1 mitigates or avoids additional wire harnesses and physical space occupied by a separate damping resistor used in conventional filter circuit apparatus, and eliminates the need for corresponding mounting and cooling devices (e.g., heat sinks, fans, etc.). In addition, for LCL filter circuits 12, integration of the damping resistor R1 with the first inductor L1 is believed to be advantageous over integrating the damping resistor R1 in the second filter inductor L4, wherein the first inductor L1 is generally smaller and does not see significant harmonic components for input filter uses, and will therefore typically run cooler than the larger second inductor L4. However, other embodiments may integrate the damping resistor with the second filter inductor for LCL implementations.

The above examples are merely illustrative of several possible embodiments of various aspects of the present disclosure, wherein equivalent alterations and/or modifications will occur to others skilled in the art upon reading and understanding this specification and the annexed drawings. In particular regard to the various functions performed by the above described components (assemblies, devices, systems, circuits, and the like), the terms (including a reference to a "means") used to describe such components are intended to correspond, unless otherwise indicated, to any component, such as hardware, processor-executed software, or combinations thereof, which performs the specified function of the described component (i.e., that is functionally equivalent), even though not structurally equivalent to the disclosed structure which performs the function in the illustrated implementations of the disclosure. In addition, although a particular feature of the disclosure may have been disclosed with respect to only one of several implementations, such feature may be combined with one or more other features of the other implementations as may be desired and advantageous for any given or particular application. Also, to the extent that the terms "including", "includes", "having", "has", "with", or variants thereof are used in the detailed description and/or in the claims, such terms are intended to be inclusive in a manner similar to the term "comprising". This description uses examples to disclose various embodiments and also to enable any person skilled in the art to practice the disclosed subject matter, including making and using any devices or systems and performing any incorporated methods. It will be evident that various modifications and changes may be made, and additional embodiments may be implemented, without departing from the broader scope of the present disclosure as set forth in the following claims, wherein the specification and drawings are to be regarded in an illustrative rather than restrictive sense.

The following is claimed:

1. A filter circuit for a power conversion system, comprising:
   a plurality of filter phase circuits, individually comprising:
   a first filter inductor including a first inductor winding wound around a core leg of a first inductor core and coupled between a phase input and a phase output of the corresponding filter phase circuit;
   a resistor including a first resistor winding with a first resistor winding portion having a first end and a second end, and a second resistor winding portion having a first end and a second end, the second ends of the first and second resistor winding portions being joined to one another to provide a first resistance between the first ends of the first and second resistor winding portions, the first and second resistor winding portions being wound proximate one another at least partially around the core leg to form an integrated apparatus with the first filter inductor; and
   a capacitance;
   the resistor being connected in series with the capacitance between first filter inductor and a filter common connection node to form an LC or LCL filter of a corresponding filter phase circuit.

2. The filter circuit of claim 1, wherein the individual filter phase circuits comprise a second filter inductor coupled in series with the first filter inductor between the phase input and the phase output of the filter circuit, and wherein the resistor and the capacitance of the individual filter phase circuits are connected in series with one another between a node joining the first and second filter inductors and the filter common connection node to form an LCL filter of the corresponding filter phase circuit.

3. The filter circuit of claim 2, wherein the resistor of a given filter phase circuit is coupled between the first filter inductor and the capacitance of the given filter phase circuit, and wherein the capacitance of the given filter phase circuit is coupled between the resistor of the given filter phase circuit and the filter common connection node.

4. The filter circuit of claim 2, wherein the capacitance of a given filter phase circuit is coupled between the first filter inductor and the resistor of the given filter phase circuit, and wherein the resistor of the given filter phase circuit is coupled between the capacitance of the given filter phase circuit and the filter common connection node.

5. The filter circuit of claim 2, wherein the first and second resistor winding portions are wound proximate the first inductor winding at least partially around the core leg.

6. The filter circuit of claim 1, wherein the resistor of a given filter phase circuit is coupled between the first filter inductor and the capacitance of the given filter phase circuit, and wherein the capacitance of the given filter phase circuit is coupled between the resistor of the given filter phase circuit and the filter common connection node.

7. The filter circuit of claim 1, wherein the capacitance of a given filter phase circuit is coupled between the first filter inductor and the resistor of the given filter phase circuit, and wherein the resistor of the given filter phase circuit is coupled between the capacitance of the given filter phase circuit and the filter common connection node.

8. The filter circuit of claim 1, wherein the first and second resistor winding portions are wound proximate the first inductor winding at least partially around the core leg.

9. A power conversion system, comprising:
   a converter stage comprising a plurality of AC phase lines, a pair of DC lines, and a plurality of switching devices individually coupled between a corresponding one of the DC lines and a corresponding one of the AC phase lines and operative according to a plurality of switching control signals to convert DC power into AC power or vice versa; and a filter circuit, comprising:

a plurality of filter phase circuits, individually coupled with one of the AC phase lines, the individual filter phase circuits comprising:

a first filter inductor including a first inductor winding wound around a core leg of a first inductor core and coupled between a corresponding one of the AC phase lines and a phase output of the corresponding filter phase circuit;

a resistor including a first resistor winding with a first resistor winding portion having a first end and a second end, and a second resistor winding portion having a first end and a second end, the second ends of the first and second resistor winding portions being joined to one another to provide a first resistance between the first ends of the first and second resistor winding portions, the first and second resistor winding portions being wound proximate one another at least partially around the core leg to form an integrated apparatus with the first filter inductor; and a capacitance;

the resistor being connected in series with the capacitance between first filter inductor and a filter common connection node to form an LC or LCL filter of a corresponding filter phase circuit.

10. The power conversion system of claim 9, wherein the individual filter phase circuits comprise a second filter inductor coupled in series with the first filter inductor between the corresponding one of the AC phase lines and the phase output of the filter circuit, and wherein the resistor and the capacitance of the individual filter phase circuits are connected in series with one another between a node joining the first and second filter inductors and the filter common connection node to form an LCL filter of the corresponding filter phase circuit.

11. The power conversion system of claim 10, wherein the resistor of a given filter phase circuit is coupled between the first filter inductor and the capacitance of the given filter phase circuit, and wherein the capacitance of the given filter phase circuit is coupled between the resistor of the given filter phase circuit and the filter common connection node.

12. The power conversion system of claim 10, wherein the capacitance of a given filter phase circuit is coupled between the first filter inductor and the resistor of the given filter phase circuit, and wherein the resistor of the given filter phase circuit is coupled between the capacitance of the given filter phase circuit and the filter common connection node.

13. The power conversion system of claim 10, wherein the first and second resistor winding portions are wound proximate the first inductor winding at least partially around the core leg.

14. The power conversion system of claim 9, wherein the resistor of a given filter phase circuit is coupled between the first filter inductor and the capacitance of the given filter phase circuit, and wherein the capacitance of the given filter phase circuit is coupled between the resistor of the given filter phase circuit and the filter common connection node.

15. The power conversion system of claim 9, wherein the capacitance of a given filter phase circuit is coupled between the first filter inductor and the resistor of the given filter phase circuit, and wherein the resistor of the given filter phase circuit is coupled between the capacitance of the given filter phase circuit and the filter common connection node.

16. The power conversion system of claim 9, wherein the first and second resistor winding portions are wound proximate the first inductor winding at least partially around the core leg.

17. The power conversion system of claim 9, wherein the converter stage is a rectifier operative to convert AC power into DC power, and wherein the filter phase circuits of the filter circuit are coupled between a multiphase AC power source and a multiphase AC input of the rectifier.

18. The power conversion system of claim 9, wherein the converter stage is an inverter operative to convert DC power into AC power, and wherein the filter phase circuits of the filter circuit are coupled between a multiphase AC output of the inverter and a multiphase AC output of the power conversion system.

19. The power conversion system of claim 9, wherein the converter stage is an inverter operative to convert DC power into AC power, and wherein the filter phase circuits of the filter circuit are coupled between a multiphase AC output of the inverter and a an output transformer of the power conversion system.

20. An integrated resistor and inductor apparatus, comprising:

an inductor core structure, comprising a first core leg;

a first inductor winding wound around the first core leg to form a first inductor; and a first resistor, comprising a first resistor winding with a first resistor winding portion having a first end and a second end, and a second resistor winding portion having a first end and a second end, the second ends of the first and second resistor winding portions being joined to one another to provide a first resistance between the first ends of the first and second resistor winding portions, the first and second resistor winding portions being wound proximate one another at least partially around the first core leg.

* * * * *